United States Patent [19]
Sakuta et al.

[11] Patent Number: 5,528,538
[45] Date of Patent: Jun. 18, 1996

[54] VOLTAGE GENERATING CIRCUIT IN SEMICONDUCTOR INTEGRATED CIRCUIT

[75] Inventors: Toshiyuki Sakuta, Ome; Tomohiro Suzuki, Tsukuba; Yuriko Iizuka, Ibaraki-ken, all of Japan

[73] Assignees: Hitachi, Ltd., Tokyo, Japan; Texas Instruments Incorporated, Dallas, Tex.

[21] Appl. No.: 84,628

[22] Filed: Jun. 30, 1993

[30] Foreign Application Priority Data

Jun. 30, 1992 [JP] Japan .................................. 4-196605

[51] Int. Cl.⁶ ............................................................ G11C 7/00
[52] U.S. Cl. ............................ 365/189.09; 365/189.11; 365/226
[58] Field of Search ..................... 365/189.09, 189.11, 365/226, 227, 229; 327/534, 535, 536, 537, 540

[56] References Cited

U.S. PATENT DOCUMENTS

| | | | |
|---|---|---|---|
| 5,119,337 | 2/1992 | Shimizu et al. | 365/189.09 |
| 5,124,574 | 6/1992 | Ibaraki | 365/226 |
| 5,208,557 | 5/1993 | Kersh, III | 327/534 |
| 5,220,534 | 6/1993 | Redwine et al. | 327/534 |
| 5,264,808 | 11/1993 | Tanaka | 327/534 |

FOREIGN PATENT DOCUMENTS 3214669  9/1991  Japan.

Primary Examiner—David C. Nelms
Assistant Examiner—Vu A. Le
Attorney, Agent, or Firm—Antonelli, Terry, Stout & Kraus

[57] ABSTRACT

A voltage generating circuit in a semiconductor integrated circuit driven by two sorts of power supply voltages, includes a unit for generating plural sorts of signals; a unit for selecting one of the plural sorts of signals in response to an operation mode of the semiconductor integrated circuit; and a pumping unit for producing either a first predetermined voltage higher than the high power supply voltage among the two sorts of power supply voltages, or a second predetermined voltage lower than the low power supply voltage by a pumping operation based upon the signal selected by the selecting unit.

13 Claims, 7 Drawing Sheets

VOLTAGE GENERATING CIRCUIT IN SEMICONDUCTOR INTEGRATED CIRCUIT

BACKGROUND OF THE INVENTION

1. Field of the Invention

The present invention relates to a voltage generating circuit in a semiconductor integrated circuit. More specifically, the present invention is directed to a voltage generating circuit having a pumping circuit in such a semiconductor integrated circuit as a dynamic RAM (random access memory).

2. Description of the Related Art

A semiconductor integrated circuit equipped with a voltage generating circuit having a pumping circuit, for instance, a dynamic RAM equipped with pumping circuits (charge pump circuits, or internal voltage regulators) for forming a substrate back-gate bias voltage and an internal boosted voltage, has been described in, for instance, U.S. patent application Ser. No. 424,904 filed on Oct. 18, 1989 and U.S. patent application Ser. No. 899,572 filed on Jun. 18, 1992 corresponding to JP-A-3-214669. Each of the pumping circuits (charge pump circuits) for producing the substrate back-gate bias voltage and the boosted voltage, respectively, is constructed of the main circuit and the subsidiary circuit, as described in these pending applications. The subsidiary circuit is so designed as to own such a small current supply capability capable of compensating the leak current and the like.

SUMMARY OF THE INVENTION

The Applicants have investigated a fact that in the respective pumping circuits, the above-described main circuit and the subsidiary circuit are not always operated at the same time, namely, that the main circuit is intermittently operated only when the power supply is turned ON and only during the specific operation mode. Accordingly, the Applicants have proposed that the capacitors of the subsidiary circuit having a relatively large occupying area be deleted, so that low power consumption of a voltage generating circuit can be achieved.

An object of the present invention is to provide a voltage generating circuit for a semiconductor integrated circuit capable of realizing a high integration and low power consumption.

In accordance with one aspect of the present invention, a voltage generating circuit in a semiconductor integrated circuit driven by two sorts of power supply voltages, includes:

a unit for generating plural sorts of signals;

a unit for selecting one of the plural sorts of signals in response to an operation mode of the semiconductor integrated circuit; and a pumping unit for producing either a first predetermined voltage higher than the high power supply voltage among the two sorts of power supply voltages, or a second predetermined voltage lower than the low power supply voltage by a pumping operation based upon the signal selected by the selecting unit.

According to one example of the present invention, the above-described plural sorts of signals have signals with different frequencies from each other.

According to one example of the present invention, when the operation mode corresponds to a turn-ON of the power supply, the selecting unit selects the signal having the high frequency among the plural sorts of signals; and the pumping unit produces the first predetermined voltage higher than the high power supply voltage among the two sorts of power supply voltages by way of the pumping operation based upon the selected signal having the high frequency.

In accordance with one example of the present invention, when the operation mode corresponds to a turn-ON of the power supply, the selecting unit selects the signal having the high frequency among the plural sorts of signals; and the pumping unit produces the second predetermined voltage lower than the low power supply voltage among the two sorts of power supply voltages by way of the pumping operation based upon the selected signal having the higher frequency.

In accordance with another aspect of the present invention, a voltage generating circuit in a semiconductor integrated circuit driven by two sorts of power supply voltages, includes:

a unit for producing at least first, second, and third signals;

a first selecting unit for selecting at least one of the first and second signals in response to the operation mode of the semiconductor integrate circuit;

a first pumping circuit for producing a first predetermined voltage higher than the high power supply voltage among the two sorts of power supply voltages by a pumping operation based upon the signal selected by the first selecting unit;

a second selecting unit for selecting at least one of the second and third signals in response to the operation mode of the semiconductor integrated circuit; and a second pumping unit for producing a second predetermined voltage lower than the low power supply voltage among the two sorts of power supply voltages by a pumping operation based upon the signal selected by the second selecting unit.

According to a further aspect of the present invention, a voltage generating circuit in a semiconductor memory driven by two sorts of power supply voltages, includes:

a unit for producing a first signal;

a unit for producing a second signal having a frequency lower than a frequency of the first signal;

a unit for generating a pulse signal based upon a predetermined timing signal which has been externally inputted, or internally produced;

a unit for selecting one of the first signal, the second signal, and the pulse signal in response to an operation mode of the semiconductor memory; and a pumping unit for producing either a first predetermined voltage higher than the high power supply voltage among the two sorts of power supply voltages, or a second predetermined voltage lower than the low power supply voltage among the two sorts of power supply voltages by a pumping operation based on the signal selected by the selecting unit.

According to one example of the present invention, when the operation mode corresponds to either a power-ON of the power supply, or a burn-in, the selecting unit selects the first signal; and the pumping unit produces the first predetermined voltage higher than the high power supply voltage among the two sorts of power supply voltages by the pumping operation based upon the selected first signal.

According to another example of the present invention, when the operation mode corresponds to a turn-ON of the power supply, or a burn-in, the selecting unit selects the first signal; and the pumping unit produces the second predetermined voltage lower than the low power supply voltage among the two sorts of power supply voltages by the pumping operation based upon the first selected signal.

In accordance with a further example of the present invention, when the operation mode corresponds to the self-refresh mode, the selecting unit selects the pulse signal.

Furthermore, in accordance with a still further example of the present invention, when the operation mode is the standby mode, the selecting unit selects the second signal.

In accordance with the voltage generating circuit in the semiconductor integrated circuit with the above-described arrangement of the present invention, one of the plural signals derived from the signal generating circuits is selected by the selector in response to the operation mode of the semiconductor integrated circuit, and the selected signal is inputted into a single pumping circuit. As a result, only a single pumping circuit for producing the voltage with regard to each of these plural signals derived from the signal generating circuits, may be commonly used. Therefore, since the capacitors employed in the pumping circuit have capacitance that are large and require a large occupied area, the pumping circuit can be commonly used by a plurality of signal generating circuits, so that the occupied areas of the voltage generating circuits can be made small.

Furthermore, the signal generating circuits generate the signals having different frequencies from each other. Since the selector selectively supplies these signals to the pumping circuit, the pumping circuit operated in response to the signal with the high frequency in a certain operation mode, may be operated in response to the signal having the low frequency in another operation mode. As a consequence, power consumption can be lowered in the latter case.

Also, since at least one oscillating circuit (for example, an oscillating circuit for oscillating a signal with a low frequency) is commonly utilized in the plural pumping circuits, power consumption of the voltage generating circuits can be lowered. Furthermore, the occupied area by the voltage generating circuits may be slightly reduced.

When the present invention is applied to a semiconductor memory, since in response to the power supply-ON mode, the burn-in mode, the self-refresh mode, the standby mode, the normal read/write mode, the fast page mode, the static column mode, and other modes, the selectors selectively selects the signal to be supplied to the pumping circuit, the occupied areas of the circuits may be made small in a similar manner to the above example. Moreover, the signal may be supplied via the selector to the pumping circuit, only if required. The signal is not always produced. As a consequence, an unnecessary current supply may be omitted, so that power consumption can be reduced.

As described above, the frequency of the pulse signal inputted into a single pumping circuit is changed in accordance with the operation mode in order to control the current supply capability from this single pumping circuit. As a consequence, the subsidiary circuit is omitted, whereby the occupied area can be made small. Also, in accordance with the employment of the capacitors having the large capacitance in the main circuit, the frequency of the pulse signal is lowered in the operation mode for compensating the leak current, so that low power consumption can be achieved.

DESCRIPTION OF THE PREFERRED EMBODIMENTS

Referring now to drawings, a voltage generating circuit employed in a semiconductor integrated circuit, according to a preferred embodiment of the present invention, will be described.

Figure 9:
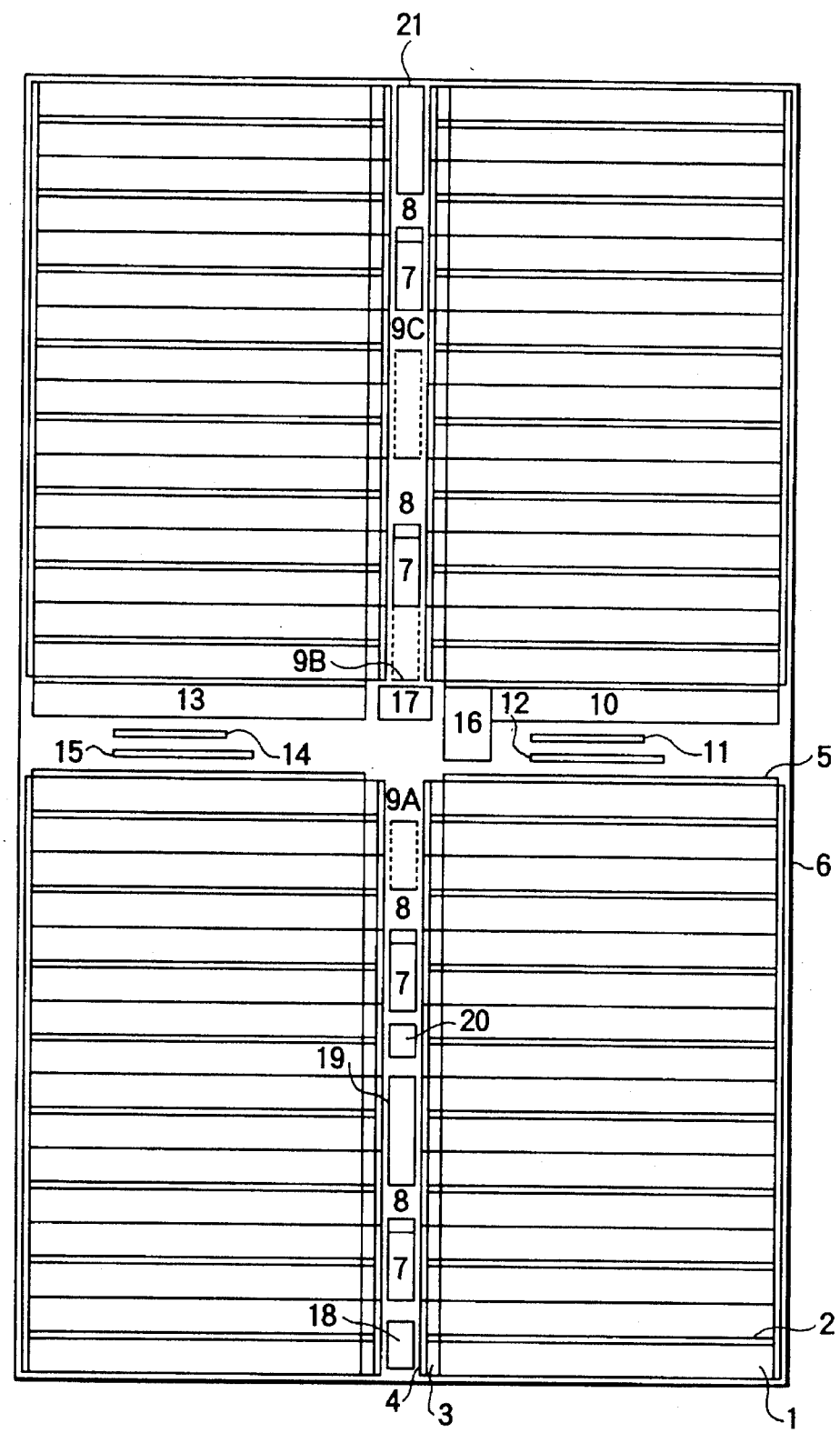
FIG. 9 is a schematic block diagram for showing one example of a dynamic RAM to which the present invention is applied.

In FIG. 9, there is shown a schematic block diagram of a dynamic RAM (random access memory) according to a preferred embodiment of the present invention. Each of circuit blocks is manufactured on a single semiconductor substrate such as a monocrystal silicon by the known manufacturing technique for the semiconductor integrated circuit. It should be noted that the respective circuit blocks shown in FIG. 9 have been drawn in conformity with the geometrical arrangement of the actual semiconductor chip. It should also be noted that a word "MOSFET" implies an insulated gate type field-effect transistor (IGFET) in the following descriptions.

This type of dynamic RAM is disclosed in U.S. patent application Ser. No. 424,904 filed on Oct. 18, 1989 and U.S. patent application Ser. No. 899,572 filled on Jun. 18, 1992, which disclosures are incorporated herein by reference.

In this preferred embodiment, the below-mentioned scheme is effected regarding the arrangements of the memory array unit and the peripheral unit for address selections and the like, which constitute the dynamic RAM, in order to prevent delays in operation speeds caused by such a fact that a semiconductor chip size is increased when a memory capacity becomes high, and as a result, lengths of various wiring patterns such as control signal lines and memory array drive signal lines are elongated.

In FIG. 9, a cross-shaped area is provided which is formed by a vertical center portion of the semiconductor chip and a horizontal center portion thereof. The peripheral circuits are mainly arranged at this cross-shaped area, whereas the memory arrays are arranged at 4-subdivided areas by this cross-shaped area. In other words, the cross-shaped area is provided at the central portion of the chip along the vertical direction and the horizontal direction, and the memory arrays are formed at the areas which are subdivided by this cross-shaped area into 4. Although no restriction is made in the following storage capacity, each of the above-described 4 memory arrays is designed to have a storage capacity of approximately 4M bits (will be discussed later). As a consequence, the four memory arrays own such a large memory capacity of approximately 16M bits in total.

A single memory mat 1 is so arranged that a word line is extended along the horizontal direction and a pair of complementary data lines, or bit lines are extended in parallel to each other along the vertical direction. A pair of memory mats 1 are arranged along the horizontal direction with respect to a sense amplifier 2, as a center thereof. The sense amplifier 2 is designed as a so-called "shared sense amplifier system" in which this sense amplifier 2 is commonly employed with regard to one pair of memory mats 1 which are arranged along the horizontal direction. Y-selection circuits 5 are provided at the memory arrays located at the center side among the 4-subdivided memory arrays. A Y-selection line is extended from the Y-selection circuit 5 over a plurality of memory mats corresponding to this Y-selection circuit 5, and is to control gate switches of column switching MOSFETs employed in the respective memory mats.

At the right-sided portion among the central portions of the memory chip in the horizontal direction, there are provided an X-related circuit 10 constructed of an X redundant circuit and an X-address driver (logic stage), a RAS (row address strobe)-related control signal circuit 11, a WE-related signal control circuit 12, and a reference voltage generating circuit 16. The reference voltage generating circuit 16 is provided near this central portion of this area, and generates a constant voltage "VL" corresponding to such a voltage as approximately 3.3 V which is applied to the internal circuit, in response to a voltage of about 5V from an external power supply VCC.

At the left side portion of the above-described semiconductor chip among the central portions along the horizontal direction, there are provided a Y system circuit 13 constructed of a Y address buffer, a Y redundant circuit, and a Y address driver (logic stage), a CAS (column address strobe) system control signal circuit 14, and a test circuit 15. At the central portion of this chip, an internal voltage limiting circuit 17.

As previously explained, when the redundant circuit involving an address buffer and an address comparing circuit corresponding to this address buffer, and also the CAS/RAS system control signal circuit for performing the control clock generation would be insentively arranged at one place, for instance when the clock generating circuit and other circuits are separated by sandwiching the wiring channels among them, in other words, when the wiring channels are commonly used, a high integration could be achieved, and therefore, signals could be transferred to the address driver (logic stage) and the like in an equidistance with the minimum short signal path.

The RAS system control circuit 11 is employed so as to activate the X address buffer upon receipt of the signal RAS. The address signal acquired by the X address buffer is supplied to the X system redundant circuit. In this redundant circuit, a comparison is made between the address signal and the stored fail address signal to judge whether or not the signal is switched to the redundant circuit. Both the judgement result and the address signal are supplied to an X system predecoder. Here, a predecoded signal is produced and then is supplied via X address drivers provided in relation to the respective memory arrays to X decoders 3 provided in relation to the above-described memory mats.

The internal signal of the RAS system control circuit is supplied to the control circuit for WE system and the control circuit for CAS system. For instance, a discrimination such as an automatic refresh mode (CBR) and a test mode (WCBR) is performed based upon the judgement result of the input sequence among the RAS signal, the CAS signal, and the WE signal. In case of the test mode, the test circuit 15 is activated, and the test function is set in accordance with a specific address signal which is supplied during this test mode.

The CAS system control circuit 14 is used to form various control signals for the Y system in response to the CAS signal. The address signal acquired by the Y address buffer in synchronism with the change into the low level of the signal CAS, is supplied to the redundant circuit for Y system. In this redundant circuit, a comparison is made between the acquired address signal and the stored fail address signal, and a judgement is made whether or not the signal is switched into the redundant circuit. Both the judgement result and the above-described address signal are supplied to the predecoder for Y system. In this predecoder, the predecoder signal is produced. This predecoder signal is supplied via the Y address drivers provided in relation with each of four memory arrays to the respective Y decoders. On the other hand, when the CAS system control circuit 14 judges the test mode based upon the judgement of input sequence upon receipt of the RAS signal and the WE signal, this CAS system control circuit 14 causes the adjoining test circuit 15 to be activated.

16 memory mats and 8 sense amplifiers are arranged in a symmetric form with respect to a center axis of an upper side area among the central portions of the semiconductor chip along the vertical direction. 4 main amplifiers 7 are provided in accordance with 4 sets of memory mats and sense amplifiers along the horizontal direction. Furthermore, there are provided at this vertical central upper portion, an internal boosted voltage producing circuit 21 for selecting a word line in response to the internal limited voltage (will be described later), and input pad areas 9B and 9C corresponding to such input signals as the address signal and the control signal. Internal voltage limiting circuits 8 which have been subdivided into 4 sets along the horizontal direction, are provided in relation to the memory blocks, by which an operation voltage of the sense amplifier 2 is produced.

In accordance with this preferred embodiment, 8 memory mats 1 and 4 sense amplifiers 2 are arranged at a single block, and then 16 memory mats and 8 sense amplifiers 2 are allocated in a symmetric form with respect to the above-explained vertical axis. With this circuit arrangement, the amplified signals from the respective sense amplifiers 2 can be transferred via a short signal transmission path to the main amplifiers 7, while a small number of main amplifiers (four amplifiers) are utilized.

Also at the lower side portion among the central portions of the chip along the vertical direction, there are arranged 16 memory mats and 8 sense amplifiers in a symmetric form along the horizontal direction with respect to the central axis of this area. 4 main amplifiers 7 are provided in relation to 4 sets of memory mats and sense amplifiers along the horizontal direction.

Moreover, there are provided at the lower portion of this central portions along the vertical direction, a substrate voltage generating circuit 18 for generating a substrate back-gate bias voltage (namely, substrate voltage) to be applied to the substrate upon receipt of the internal limited voltage, an input pad area 9A is relation to the input signals such as the address signal and the control signal, data output buffer circuit 19, and a data input buffer circuit 20.

In relation to the memory blocks, there are provided internal limited voltage generating circuits 8 which generate operation voltages of the sense amplifiers 2 and have been subdivided into 4 sets along the horizontal direction. As a result, the amplified signals from the respective sense amplifiers 2 can be transferred via a short signal transmission path to the main amplifiers 7, while a small number of main amplifiers 7 such as four main amplifiers are utilized.

Although not shown in this drawings, various sorts of bonding pads are arranged at the regions of the above-described vertical central portions other the areas 9A to 9C. As an example of these bonding pads, they are pads used for the external power supply. Several tens of pads (relative large numbers of pads) are substantially arranged along a straight line, which are employed to supply a ground voltage Vss to a circuit in order that an input level margin is increased, namely a power supply impedance is lowered. These ground voltage pads are connected to ground voltage leads which are formed by the LOC technique and extended along the vertical direction.

Among these ground voltage pads, some pads are mainly employed to lower the power supply impedance, which are especially provided to prevent the floatings caused by clearing the word lines and also by coupling of the nonselected word lines in the word drivers, and, furthermore, are provided as a common source of the sense amplifier. As a result, the ground potential (voltage) of the circuit is set to lower the power supply impedance with respect to the operations of the internal circuit. Also, as described above, since the ground wiring patterns, subdivided into plural sorts of patterns and mutually connecting the interval circuits, are connected by the low-pass filter constructed of the LOC lead frames and the bonding wires, productions of noise can be suppressed to a minimum level and also transmissions of the circuit ground line noise among the internal circuits can be suppressed to a minimum level.

In this preferred embodiment, the pads related to the external power supply VCC such as approximately 5 V are provided respectively in accordance with the internal voltage limiting circuits 8 and 17 for performing the above-described voltage converting operation. This similarly implies that the power supply impedance is reduced and the noise transmission of voltages (VCC, VDL and VCC) among the internal circuits is suppressed to low voltage levels.

Pads A0 to A11 for inputting the address data, and pass RAS, CAS, WE and OE for inputting the control signals are arranged at the above-described areas 9A and 9C. In addition, there are provided the below-mentioned pads for inputting/outputting data, pads for bonding master and monitor, and pads for controlling the monitoring pads. As the bonding master pads, there are pads for designating the static column mode, pads for designating the nibble mode, and pads for designating the write mask function in case of 4-bit structure. As the monitoring pads, there are pads for monitoring the respective internal voltages VCL, VDL, VL, VBB, VC and VPL.

VCL among the above-described internal voltages corresponds to a power supply voltage of about 3.3 V for the peripheral circuit, and is commonly produced by the internal voltage limiting circuit 17. VDL corresponds to another power supply voltage of about 3.3 V to be applied to the memory array, namely the sense amplifier 2. As described above, 4 power supply voltages VDL are provided in relation to the 4 memory blocks in this preferred embodiment. VCH corresponds to a boost power supply voltage for selecting a selection level of the word line, which is boosted by about 5.2 V in response to the above-described internal voltage VDL, and also the shared switch MOSFET. VBB is a substrate back-gate bias voltage of −2 V, VPL is a plate voltage of the memory cell, and VL is a constant voltage of about 3.3 V to be applied to the internal voltage limiting circuits 8 and 17.

Figure 1:
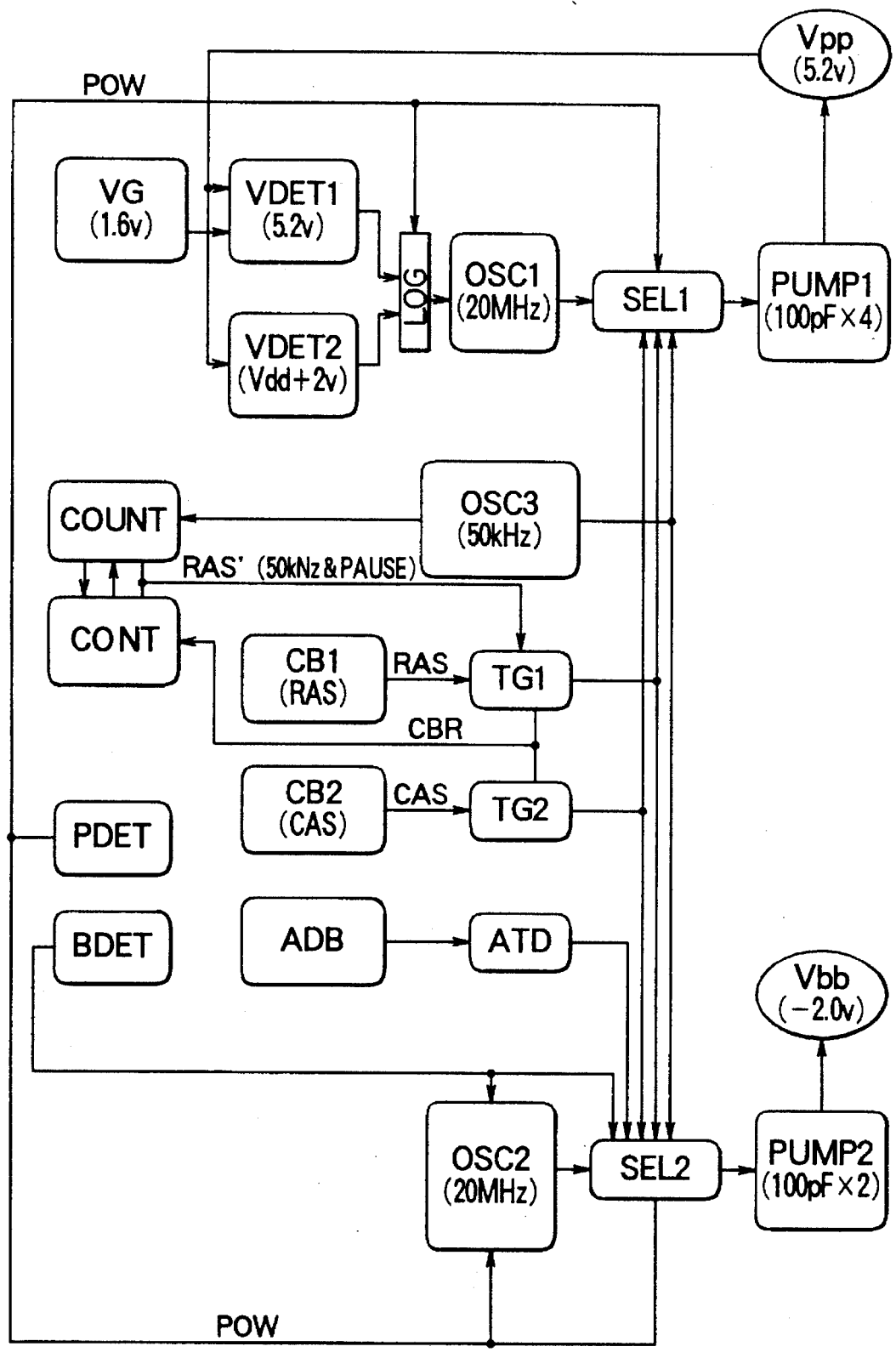
FIG. 1 is a schematic block diagram for representing a substrate voltage generating circuit and a boosted voltage generating circuit, which correspond to a voltage generating circuit in a dynamic RAM according to a preferred embodiment of the present invention.
Figure 2:
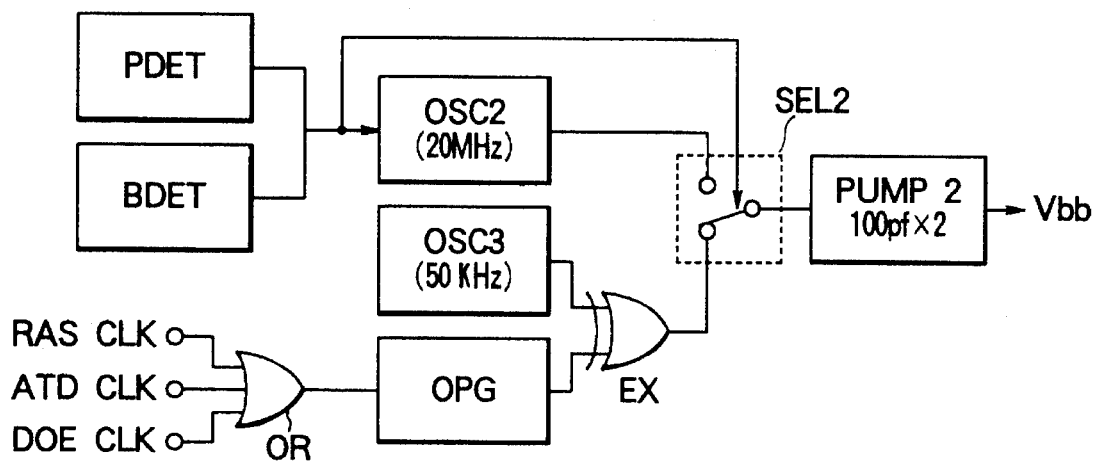
FIG. 2 is a schematic block diagram for showing in detail the substrate voltage generating circuit of FIG. 1.
Figure 3:
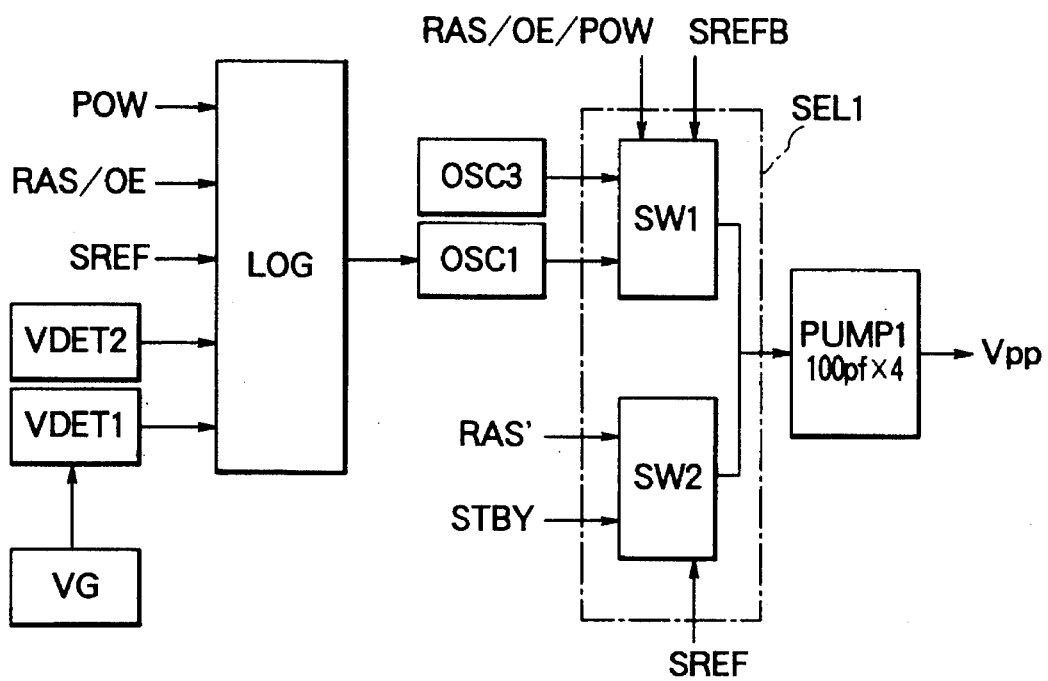
FIG. 3 is a schematic block diagram for representing in detail the boosted voltage generating circuit of FIG. 1.

In FIG. 1, there is represented a block diagram of a substrate back-gate bias voltage generating circuit and a boosted voltage generating circuit as the voltage generating circuit according to a preferred embodiment of the present invention. FIG. 2 is a circuit block diagram for showing in detail the substrate back-gate bias voltage (substrate voltage) generating circuit, whereas FIG. 3 is a circuit block diagram for indicating in detail the boosted voltage generating circuit. The respective circuit blocks shown in these circuits are built in a semiconductor integrated circuit for constituting a dynamic RAM as indicated in FIG. 9.

First, a description will now be made of the substrate back-gate bias voltage generating circuit with reference to FIGS. 1 and 2. In FIGS. 1 and 2, the substrate back-gate bias voltage (namely substrate voltage) Vbb is produced by a pumping circuit (charge pump circuit, or internal voltage regulator) PUMP 2. Upon receipt of a pulse signal supplied from a selector SEL2, the pumping circuit PUMP 2 generates a negative substrate back-gate bias voltage Vbb. As will be described later, the pumping circuit PUMP 2 employs, for instance, two capacitors having large capacitances to invert the polarity of the input pulse and then rectify the inverted input pulse, whereby the substrate back-gate bias voltage Vbb is produced.

In this preferred embodiment, the following two operations are performed by employing a single pumping circuit with the capacitances having such a large capacitance, namely an operation for pulling up the substrate voltage to −2 V with a relatively high current supply capability as when the power supply is turned on, and also another operation for maintaining the substrate voltage with a relative low current supply capability capable of supplying a leak current under an active state and a standby state.

The selection of the above-described two sorts of current supply capabilities in response to the operation modes is performed by switching the selector SEL2, in response to the operation mode, to selectively input to the pumping circuit, a pulse signal having such a high frequency of, for example, 20 MHz, which is produced by the oscillation circuit OSC 2, a pulse signal having such a low frequency of, for instance, 50 KHz, which is formed by an oscillation circuit OSC 3, a refreshing control signal RAS externally inputted via the control buffers CB1 and CB2, an internal RAS signal produced by a refresh control circuit CONT during the refresh operation, and also a 1-shot pulse signal produced based upon a change detection signal of an address signal.

A power supply turn-ON detecting circuit PDET produces the above-described pulse signal having such a high frequency as approximately 20 MHz by supplying a signal POW to the oscillating circuit OSC 2 in order to cause the oscillating circuit OSC 2 to oscillate from the time of turn-ON of the power supply until the substrate voltage Vbb reaches −2 V, supplies this pulse signal to the pumping circuit PUMP, so that the substrate potential is quickly pulled up to −2 V with maintaining the large current supply capability. As a result, a voltage rising time defined from the turn-ON of the power supply until the dynamic RAM is operable, may be shortened. The power supply turn-ON detecting circuit PDET monitors the substrate potential Vbb, interrupts the output of the signal POW when this substrate potential reaches a target potential such as −2 V, whereby the operation of the oscillating circuit OSC 2 is stopped.

A burn-in test (or aging test) is carried out so as to investigate an initial failure of the dynamic RAM. In the burn-in test, the dynamic RAM is positioned into an oven at a high temperature, and is operated under an upper limit voltage allowable for operation. In such a burn-in test, since a large leak current will be flown in the substrate, the substrate potential becomes high even when the pumping circuit PUMP 2 is operated with maintaining a relative small current capability as in the normal operation. As a consequence, there is a risk in destruction of a semiconductor element due to CMOS latch up.

A burn-in detecting circuit BDET causes the oscillating circuit OSC 2 to be oscillated when a high operation voltage is detected during the burn-in test mode, thereby producing a pulse signal with a high frequency in a similar manner when the power supply is turned ON. Furthermore, this burn-in detecting circuit controls the selector SEL 2 to supply this high-frequency pulse signal to the pumping circuit PUMP 2. As a consequence, the pumping circuit PUMP 2 is operated in response to such a high-frequency pulse signal as approximately 20 MHz, and can maintain the substrate potential to a sufficiently low potential under stable conditions by such a pull-up current for compensating the relative high substrate current flowing during the burn-in test.

In FIG. 2, a top priority is given to the above-described cases that when the power supply is turned ON and the burn-in test is performed, a switch for constituting the selector SEL 2 is switched to the side of the oscillating circuit OSC 2. As a consequence, even when other control pulses are produced by the oscillating circuit OSC 3, the pumping circuit PUMP 2 does not respond to the latter oscillating operation condition. In other words, since the charge pumping operation is performed in response to such a high-frequency pulse signal as approximately 20 MHz produced by the oscillating circuit OSC 2 during the turn-ON of the power supply and the burn-in test, the pumping circuit need not be sequentially operated in response to the above-explained low-frequency pulse and control signals.

In the case of other conditions than that of the above-explained turn-ON of the power supply and burn-in test, the switch for constituting the selector SEL 2 is switched, and then the pumping circuit PUMP 2 owns such a small current supply capability for compensating the substrate leak current and the like. The oscillating circuit OSC 3 is normally operated to produce the pulse signal having such a low frequency of approximately 50 KHz. The reason why such a low-frequency pulse signal is produced, is because the pumping circuit PUMP 2 is associated with capacitors having a large capacitance similar to that of the conventional main circuit, and can store large electron charges during a single charge pump operation.

That is to say, in the conventional subsidiary circuit, since the capacitors having the small capacitance, as compared with the capacitance of the main circuit, are employed to perform the charge pump operation, such a high frequency as approximately 1 MHz is set so as to obtain the current supply capability for compensating the leak current. To the contrary, the pumping circuit PUMP 2 with the capacitors having the large capacitance is employed which constitutes the main circuit, whereby the leak current is compensated. Accordingly, in case that this current supply capability is set to the same current supply capability, the frequency can be set to a low value in accordance with the large capacitance of the capacitors.

Since the above-described oscillating circuit OSC 3 is normally operated, the oscillation frequency may be set to be a low value, which implies that a consumption current of this oscillation can be lowered. Since consumption current in a CMOS circuit is substantially proportional to an operation frequency, a reduction of, the oscillation frequency to about ½ implies that the consumption current at the oscillating circuit may be reduced to about ½. In accordance with this preferred embodiment, it is utilized such a fact that the above-described oscillating circuit OSC 3 is normally operated, and this oscillating signal (pulse signal) is used as a reference time signal for a refresh timer. In other words, the oscillating output of the oscillating circuit OSC 3 is supplied to a binary counter circuit COUNT. A count signal of this binary counter circuit is transferred to a control circuit CONT, so that an internal signal RAS' is produced in accordance with a self-refresh period during which before storage information of a memory cell is lost under the standby condition, this storage information is read out and then rewritten into the memory cell. Although not shown in the drawing, a refresh address signal is generated in accordance with an address stepping operation based upon the above internal signal RAS', and the above-explained data holding operation is performed in a self-refresh controlling circuit.

As the refresh operation, there is a CBR refresh mode other than the above-described self-refresh operation, in which the refresh operation is externally designated. That is to say, prior to the RAS signal, the CAS signal is set to a low level by the timing circuits TG1 and TG2, so that a CBR refresh mode is designated. In the CBR refresh mode, all of the circuits belonging to the column system are disabled, and only the circuits belonging to the row system are operated in synchronism with the external RAS, so that the memory cell is rewritten. Clock pulses RAS, DOE for setting the dynamic RAM to active states, and an address signal change detecting pulse ATD are supplied via an OR gate to a 1-shot pulse generating circuit OPG, and then are converted into pulse signals which are generated at the timing when the signals are changed. The RAS signal essentially corresponds to a chip select signal. In response to this chip select signal, an acquisition operation of an address signal, an address selecting operation for the X system, and an activation of the memory cell, and also the rewriting operation to the memory cell are carried out. Since a current is flown in the substrate in accordance with such an operation, the pumping circuit PUMP 2 is activated in order to compensate it. It should be noted that the above-described RAS signal contains the control signal RAS' for the CBR refresh and the self-refresh, which is formed in the internal circuit.

The address signal change detecting circuit ATD fixes the address of the row system, while the RAS signal and the CAS signal are maintained at the low level, detects a change in the address signal in case of such a static column mode that the address for the column system is changed via the address buffer ADB, and operates the pumping circuit PUMP 2 for compensating the current since this current is flown through the substrate in response to the column selection operation. When the data output signal DOE is activated, since the current is flown through the substrate in response to the operation of the output buffer circuit for flowing a relatively large output current, the pumping circuit PUMP 2 is operated for compensating it.

TABLE 1

|       | powerup | active | standby | self REF | burnin |
|-------|---------|--------|---------|----------|--------|
| OSC 2 | O       | x      | x       | x        | O      |
| OSC 3 | x       | O      | O       | O        | x      |
| CLK   | x       | O      | x       | O        | x      |

A relationship between the above-explained various operation modes and the input pulses for operating the pumping circuit PUMP 2 is represented in a table 1. Symbol "power up" indicates a mode during a turn-ON of a power supply. Symbol "active" denotes a mode when RAM is accessed. Symbol "standby" shows a mode when no access is made to RAM. Symbol "self REF" represents a self-refresh mode. Symbol "burnin" indicates in case of a burn-in test.

As described above, the selector SEL 2 is selected in response to the respective operation modes. When the oscillating circuit OSC 2 is not operated, the oscillating circuit OSC 3 is continuously operated. Under such a condition, when any one of the signals RAS/ATD/DOE is supplied to the circuit OPG, an exclusive OR gate is employed in order that only the output pulse of the circuit OPG is supplied to the selector SEL 2.

As a consequence, in the substrate voltage generating circuit with such a circuit arrangement, the selector SEL 2 selects the corresponding signal in response to the respective operation modes and then supplies the selected signal to the pumping circuit PUMP 2, so that the substrate voltage is maintained.

Next, a description will now be made of the boosted voltage generating circuit with reference to FIG. 1 and FIG. 3.

In FIGS. 1 and 3, a boosted voltage Vpp is produced by a pumping circuit PUMP 1. Upon receipt of a pulse signal supplied from the selector SEL 1, the pumping circuit PUMP 1 generates such a boosted voltage as 5.2 V. The pumping circuit PUMP 1 produces a bootstrap voltage by employing capacitors and rectifies this boostrap voltage, thereby producing the boosted voltage Vpp.

In this preferred embodiment, the following two operations are performed by the single pumping circuit having the capacitors with the large capacitance, namely, an operation to produce the boosted voltage rapidly rising with a relatively high current supply capability as in such a case that the power supply is turned ON, and also another operation to maintain a high voltage with a relative low current supply capability capable of compensating the leak current and the operation current under the active state and the standby state.

A selection of the above-explained two sorts of current supply capabilities in response to the above-described operation modes is performed by operating the selector SEL 1 in response to the operation mode by selecting a pulse signal having such a high frequency as, for instance, approximately 20 MHz, which is produced by the oscillating circuit OSC 1, a pulse signal having such a low frequency as, for example, approximately 50 KHz, which is produced by the oscillating circuit OSC 3 commonly used with the circuit for producing the above-described substrate back-gate bias voltage Vbb, and the 1-shot pulse signal produced based upon the externally inputted control signal RAS, and the internal signal RAS' produced by the refresh control circuit CONT during the self-refresh mode, And, these signals are selectively inputted to the pumping circuit PUMP 1, whereby the current supply capabilities are changed.

In FIG. 3, a logic circuit LOG inputs therein the output signals from the voltage detecting circuits VDET1 and VDET2, and the various signals POW, RAS/OE, SREF, and supplies these signals to the oscillating circuit OSC 1 in accordance with a predetermined priority order. That is to say, for instance, when the power supply is turned ON, since the boosted voltage Vpp is low, the oscillating circuit OSC 1 is driven with a top priority in response to the signal POW. When a judgement is made by the voltage detecting circuit VDET 1 that the boosted voltage Vpp reaches a desirable voltage 5.2 V, the oscillating circuit OSC1 is driven in response to the clock of the signal RAS, whereas when another judgement is made by the voltage detecting circuit VDET 1 that the boosted voltage Vpp does not reach this desirable voltage 5.2 V, the oscillating circuit OSC1 is driven irrelevant to the signal RAS. In case that the boosted voltage Vpp exceeds the operation voltage Vdd+2 V, the voltage detecting circuit VDET 2 outputs a signal representative of this fact. The signal SREF is such a signal for indicating that the operation mode is entered to the self-refresh mode. As a consequence, when any one of these signals is supplied to the logic circuit LOG, the oscillating circuit OSC 1 stops its oscillation, irrelevant to such a fact that other signals (POW, RAS/OE, and output from VDET 1) have been furnished to the logic circuit LOG.

A selector circuit SEL1 has switches SW1 and SW2, to which self-refresh signals SREF and SREFB (SREF) are applied. These signals are to activate (e.g. refresh or make conductive) the switches SW1 and SW2. In response to the refresh signal SREF, the switch SW1 is not refreshed and also the switch SW2 is refreshed. Conversely, in response to the refresh signal SREFB, the switch SW1 is refreshed and the switch SW2 is not refreshed. As a consequence, in the refresh mode, the pumping circuit PUMP 1 is driven by the switch SW2 in response to the internal RAS signal RAS', whereas under such a pause condition that the supply of the internal RAS signal RAS' is interrupted, namely under a standby condition, the pumping circuit is driven in response to the standby signal STBY. When not in the refresh condition, the output from the oscillating circuit OSC 1, the output from the oscillating circuit OSC 3, and any one of the signals RAS/OE/POW are selectively supplied to the pumping circuit PUMP 1 by way of the switch SW1, so that this pumping circuit PUMP 1 is driven. In other words, when the oscillating circuit OSC 1 is oscillated, the oscillation signal is supplied to the pumping circuit PUMP 1; when any one of these signals RAS/OE/POW is present, this signal is supplied to the pumping circuit PUMP 1; and when the oscillating circuit OSC 1 is not oscillated and none of these signals RAS/OE/POW are present, the output from the oscillating circuit OSC 3 is supplied to the pumping circuit PUMP 1.

A reference voltage generating circuit VG generates a reference voltage such as approximately 1.6 V. This reference voltage is applied to the voltage detecting circuit VDET 1. The voltage detecting circuit VDET 1 produces such a divided voltage by a voltage dividing circuit that a divided voltage becomes about 1.6 V when the boosted voltage Vpp is about 5.2 V, and detects whether or not the boosted voltage reaches a desirable voltage by comparing the divided voltage with the above explained reference voltage. In other words, when the power supply is turned ON, if the boosted voltage Vpp is low, then the voltage detecting circuit VDET 1 detects this fact, and the oscillating circuit OSC 1 is operated by the logic circuit LOG.

Accordingly, the oscillating circuit OSC 1 performs the oscillating operation by the voltage detecting circuit VDET 1 from the turn-ON of the power supply until the boosted voltage Vpp reaches 5.2 V, whereby the pulse signal having such a high frequency of approximately 20 MHz, is supplied to the pumping circuit PUMP 1 so as to quickly raise the boosted voltage up to 5.2 V with the large current supply capability. As a result, the rising time defined since the power supply is turned ON until the dynamic RAM is brought into the operable state, may be shortened. The power supply turn-ON detecting circuit PDET monitors the boosted voltage Vpp, and interrupts the operation of the oscillating circuit OSC 1 by stopping the supply of the signal POW.

A burn-in test (or aging test) is executed in order to investigate an initial failure of the dynamic RAM. During the burn-in test, the dynamic RAM is positioned into an oven heated at a high temperature, and is operated at an allowable upper limit voltage. In such a burn-in test, the operation voltage is set to a high voltage. As a consequence, with respect to the abovedescribed fixed level such as 5.2 V, a level becomes relatively short. Thus, the voltage detecting circuit VDET 2 monitors whether or not +2 V is present with respect to the operation voltage Vdd. If the voltage level comes up short, then the oscillating circuit OSC 1 is operated.

Under such a case other than the above-described turn-ON of power supply and burn-in test, a selection is made that the pumping circuit PUMP 1 owns such a small current supply capability that the boosted voltage Vpp is not lowered by the operation current and the leak current. As described above, the oscillating circuit OSC 3 is normally operated to produce the pulse signal having such a low frequency of about 50 KHz. The reason why such a low-frequency pulse signal is produced, is such that the pumping circuit PUMP 1 owns the capacitors having the large capacitance similar to that of the conventional main circuit, and can store large electron charges under the single charge pump operation.

In other words, in the conventional subsidiary circuit, since the charge pump operation is performed with employment of the capacitors having a smaller capacity than that of the main circuit, the oscillating frequency must be set to such a high frequency of approximately 1 MHz in order to obtain the current supply capability for compensating the leak current. To the contrary, since the leak current is compensated by employing the pumping circuit PUMP 1 with the capacitors having the large capacity, which constitutes the main circuit, the frequency can be set to be a low value, depending upon the capacity of the capacitors, when the same current supply capability is set as the above-described current supply capability.

Since the oscillating circuit OSC 3 is normally operated, the oscillating frequency thereof may be set to be a low value, which implies the consumption current therein may be reduced. Also, as the oscillating circuit OSC 3 may be commonly used by the boosting voltage circuit and the substrate voltage generating circuit, low power consumption may be achieved.

Figure 4:
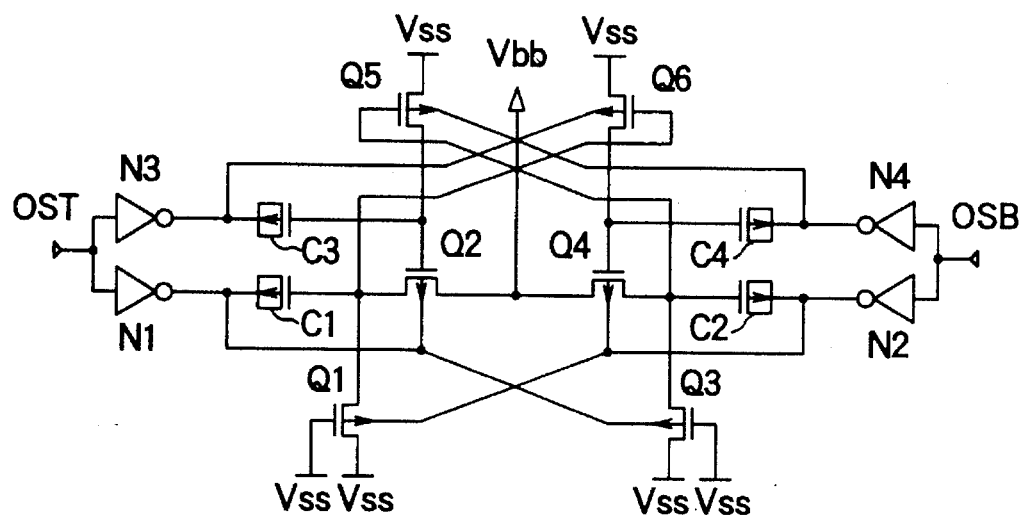
FIG. 4 is a circuit diagram of one example of a pumping circuit employed in the substrate voltage generating circuit of FIG. 2.

In FIG. 4, there is shown a circuit diagram of one example of the pumping circuit PUMP 2 employed in the substrate back-gate bias voltage generating circuit Vbb-GEN. This pumping circuit PUMP 2 is arranged by employing p-channel type MOSFETs Q1 to Q6. The p-channel type MOSFETs are fabricated in an N-type well region. As a consequence, since this N type well region is electrically separated from a p type well region where the memory cell is formed, and no minority carrier is produced in the N type well region during the charge pump operation, no adverse influence is given to the memory cell formed in the P type well region.

Figure 6:
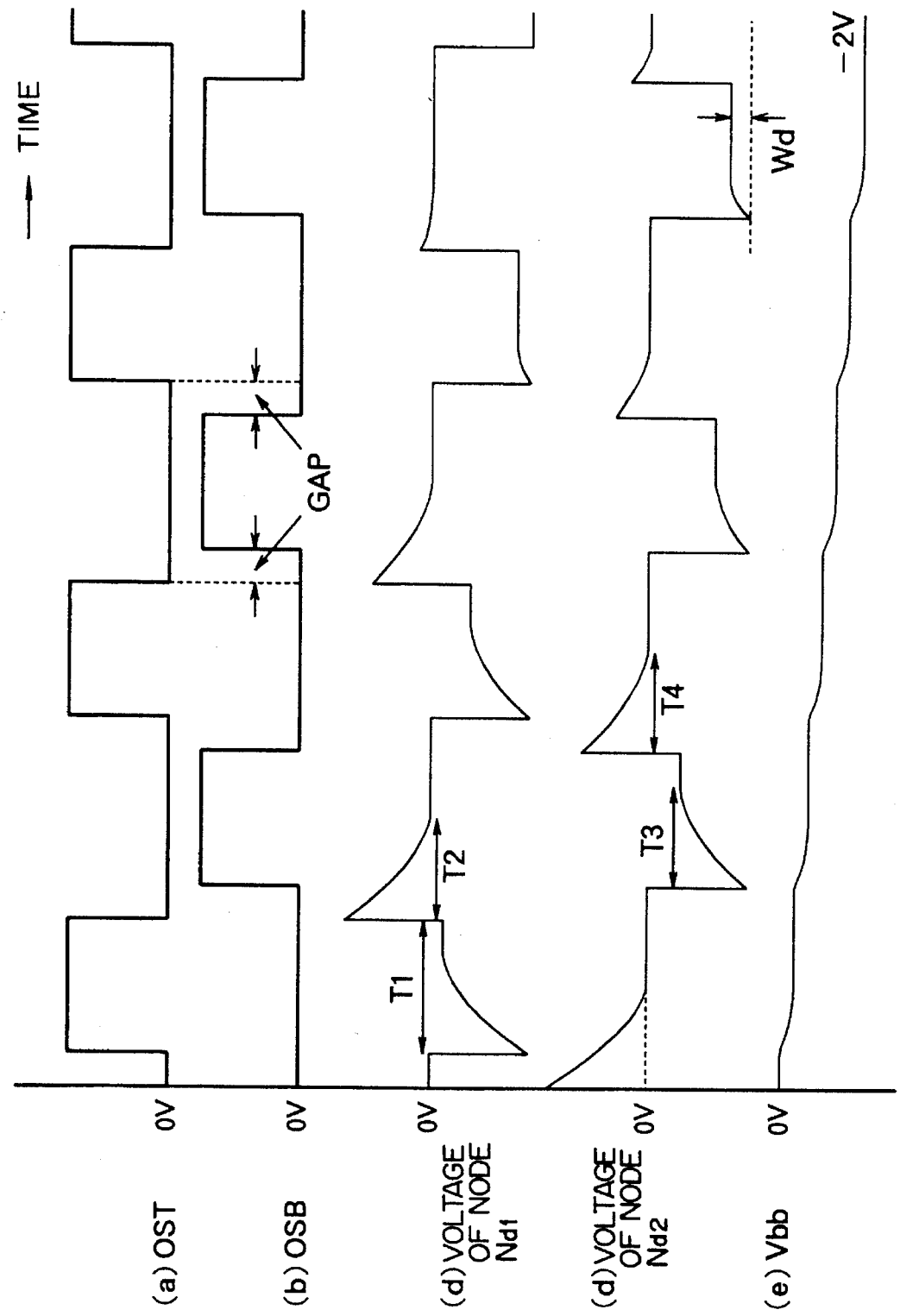
FIG. 6 shows a waveform chart for explaining operation of the pumping circuit in FIG. 5.

A basic circuit of a pumping circuit for generating a negative voltage Vbb is constructed by a capacitor C1 and the MOSFET Q1, Q3. Although a capacitor C2 and the MOSFETs Q2, Q4 constitute a similar basic circuit, as shown in FIG. 6, inputted pulses OST and OSB have such a reverse phase relationship that active levels thereof are not overlapped with each other, and the MOSFETs are alternately operated in response to the input pulses, so that the charge pump operation is performed at a high efficiency.

It should be noted that the capacitances of the capacitors C1 and C2 are large, for instance, 100 pF, and the capacitances of other capacitors are, for example, 1 pF.

Basically, the MOSFETs Q1 and Q3 may be constructed in a diode form. If so constructed, then a level loss appears by the threshold voltages thereof. When the high level of the pulse signal OST is such a low voltage as 3.3 V, the MOSFETs are not practically operable. Therefore, considering that the MOSFET Q3 may be brought into the ON state when the input pulse is at the low level, an inverter circuit N3 for forming a pulse similar to the input pulse, a capacitor C3 and a switch MOSFET Q5 are provided to produce a negative control voltage. As a result, a negative potential of the capacitor C1 can be transferred to the substrate side without any level loss. The MOSFET Q5 is brought into the ON state when the negative voltage is produced by the other input pulse OSB, and performs the charge-up operation of the capacitor C3. The capacitor C3 has a small capacitance capable of producing the control voltage for the MOSFET Q2.

The MOSFET Q1 is brought into the OFF state at the quick timing by receiving the output signal with the high level of the driving inverter circuit N2 at the back gate thereof upon receipt of the other input pulse OSB, the pull up of the substrate potential is performed at a high efficiency. Similarly, the MOSFET Q2 is brought into the OFF state at the quick timing when the capacitor C1 is charged up by supplying the output signal of the driver inverter circuit N1 to the back gate of this MOSFET Q2, whereby a leak of the substrate potential Vbb is minimized. Such a pulse signal is employed which is produced based upon the control voltage applied to the gate of the MOSFET Q4, corresponding to the other input pulse OCB, the pulse signal produced by the capacitor C4 and the inverter circuit N4 which is operated in a similar manner to the back gate voltages of the MOSFETs Q2 and Q4, and the input pulse OST.

Figure 5:
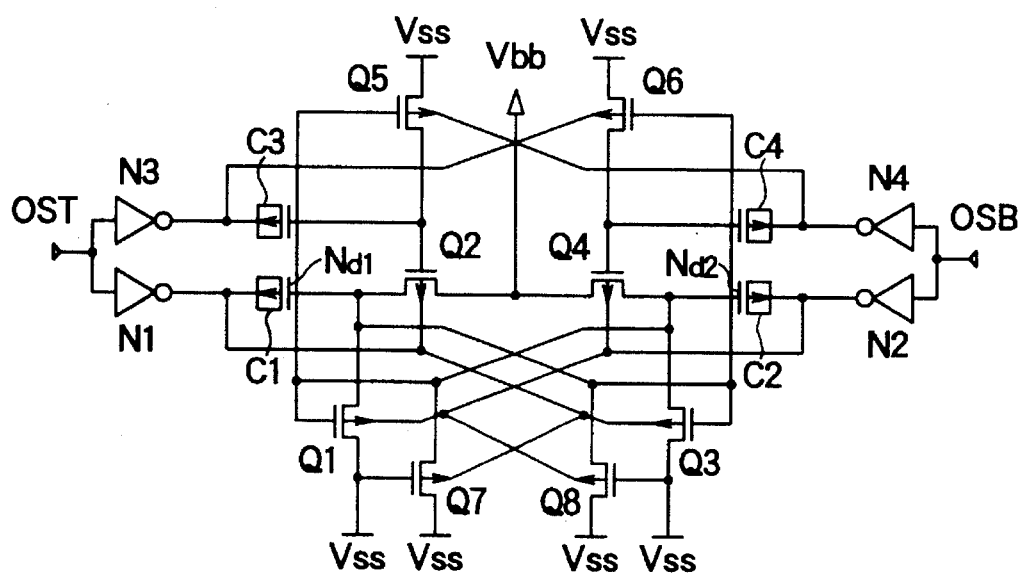
FIG. 5 is a circuit diagram of another example of the pumping circuit employing in the substrate voltage generating circuit of FIG. 2.

In FIG. 5, there is shown a circuit diagram of another example of the pumping circuit PUMP 2 employed in the substrate back-gate bias generating circuit Vbb-GEN. In this preferred embodiment, the MOSFET Q1 (Q3) is controlled by the output signal from the driving inverter circuit N2 (N1) for receiving the other input pulse OSB (OST) in a similar manner to the MOSFET Q5 (Q6). Also, an MOSFET Q7 (Q8) for pulling up the gate voltage of the MOSFETs Q1, Q5 (Q3, Q6) at the quick timing. This MOSFET Q7 (Q8) is so connected that the gate electrode thereof is commonly connected to the drain to form a diode, and is switch-controlled with the MOSFET Q1 in a complementary mode by supplying the output signal of the driving inverter circuit N1 (N2) for receiving the input pulse OST (OSB) to the back gate. As a result, when the output signal of the driving inverter circuit N1 (N2) is changed into the low level in response to the input pulse OST (OSB), since the MOSFET Q1 (Q3) is changed from the ON-state to the OFF-state at the quick timing, the substrate potential can be pulled up to the negative potential at a high efficiency.

Also in the pumping circuit PUMP 1 shown in FIG. 5, the capacitances of the capacitors C1 and C2 are selected to be large, for instance, 100 pF, and a capacitance of another capacitor is selected to be, for example, 1 pF.

FIG. 6 is a timing chart for representing an operation of the pumping circuit PUMP 2 of FIG. 5. (a) and (b) of FIG. 6 indicate waveforms of input pulses OST and OSB, respectively. One of these input pulses corresponds to a pulse which has been selected by the selector SEL 2, and the other input pulse is obtained by inverting the first-mentioned pulse. These pulses own a reverse relationship with each other. It should be noted that gaps are provided in the input pulse OSB with regard to the other input pulse OST so as to prevent that the pumping efficiency is lowered (namely, in order to prevent the reverse flow of the electron charges between two pumps). (c) and (d) of FIG. 6 represent voltage waveforms at gate nodes Nd 1 and Nd 2 of the MOS capacitances C1 and C2, respectively. (e) of FIG. 6 indicates a substrate back-gate bias voltage Vbb. In the waveforms (c), (d) and (e) of FIG. 6, the electron charges are moved from the Vbb output terminal via the transistor Q2 to the node Nd1 within a section T1, whereas the electron charges are moved from the node Nd1 via the transistor Q1 to the ground potential Vss within a section T2. Within a section T3, the electron charges are moved from the Vbb output terminal via the transistor Q4 to the gate node Nd2, whereas the electron charges are moved from the gate node Nd2 via the transistor Q3 to the ground potential Vss within a section T4. As described above, in response to the input pulses OST and OSB, the substrate back-gate bias voltage Vbb is gradually decreased from 0 V, as shown in (e) of FIG. 6, and reaches −2 V that is lower than the ground potential. The value of the substrate back-gate bias voltage Vbb when a voltage width "Wd" becomes 0 shown in (d) of FIG. 6, corresponds to the final approach level of this substrate back-gate bias voltage Vbb.

It should be noted that the operation of the pumping circuit shown in FIG. 4 is substantially similar to that of the pumping circuit indicated in FIG. 5.

Figure 7:
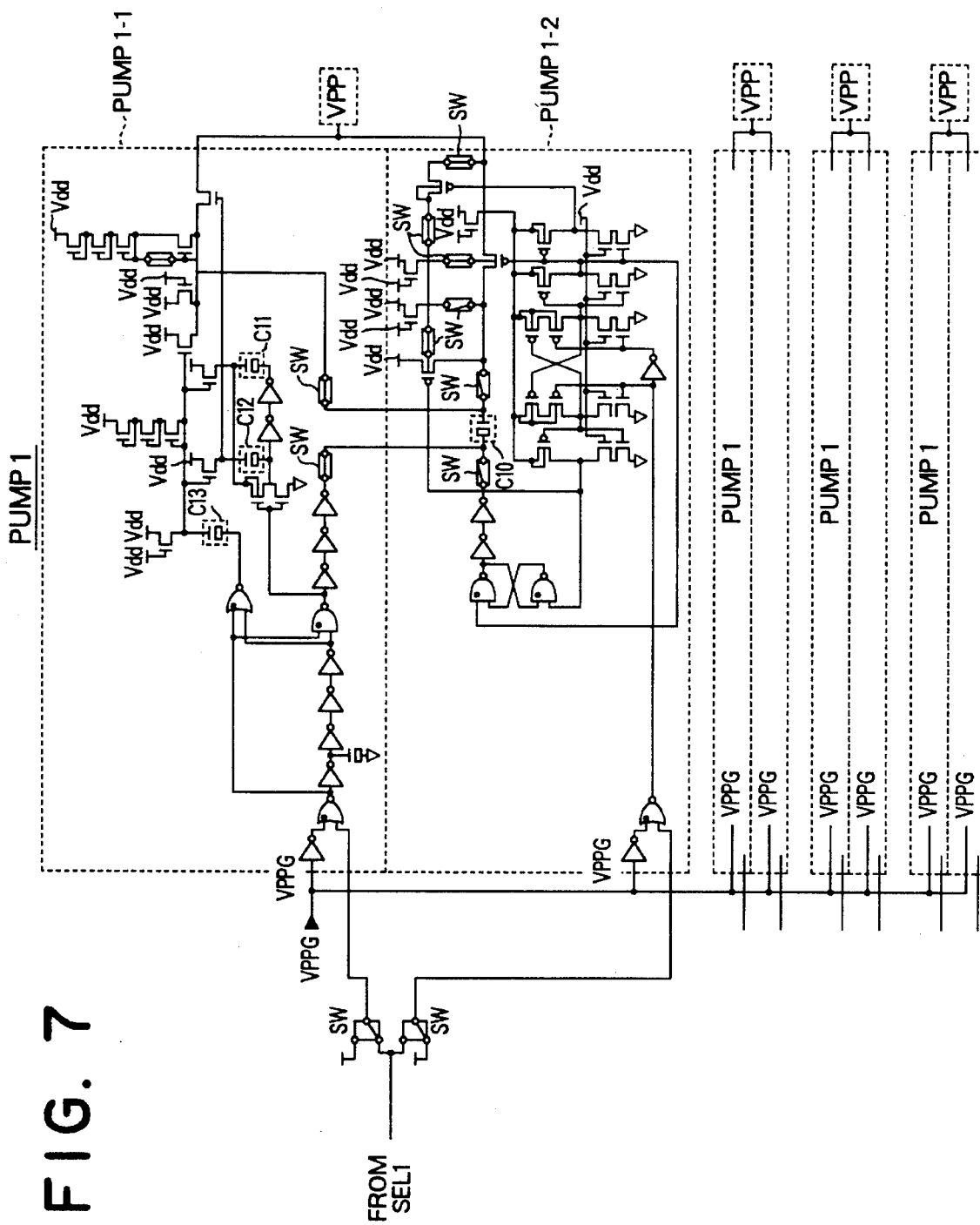
FIG. 7 is a circuit diagram for representing one example of a pumping circuit employed in the boosted voltage generating circuit of FIG. 3.

FIG. 7 is a circuit diagram for showing one example of the pumping circuit PUMP 1 employed in the boosted voltage generating circuit Vpp-GEN. The pumping circuit PUMP 1 of FIG. 7 has, for instance, two pumping circuits PUMP 1-1 and PUMP 1-2, which are selectively driven by switches SW. In FIG. 7, the first pumping circuit PUMP 1-1 is driven. A capacitor C10 having a large capacitance, e.g., 100 pF is commonly employed for the pumping circuits PUMP 1-1 and PUMP 1-2. Under the condition of FIG. 7, this capacitor C10 is utilized in the pumping circuit PUMP 1-1. Other capacitors C11 to C13 are MOS capacitors. In FIG. 7, symbol VPPG indicates a signal for stopping the pumping operation. This stopping signal is normally under high state, which never stops the pumping operation. For instance, there are provided four pumping circuits PUMP 1 which are connected via the corresponding selectors to the relevant oscillating circuits and the like, as shown in FIG. 8.

Figure 8:
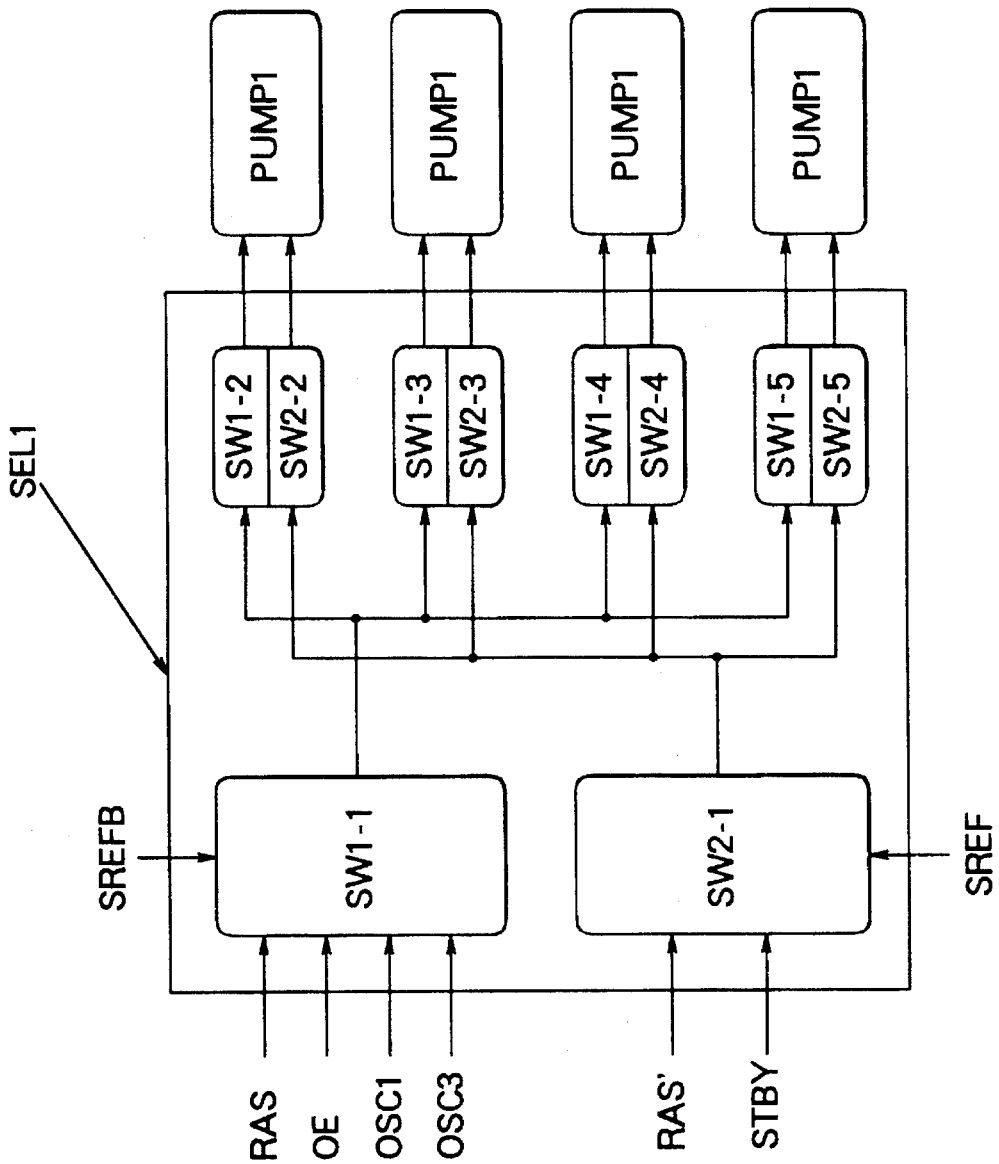
FIG. 8 is a schematic block diagram for indicating a relationship between a selector and the pumping circuits employed in the boosted voltage generating circuit of FIG. 3.

In FIG. 8, the switches SW1 and SW2 shown in FIG. 3 correspond to switches SW1-1 to SW1-5 and switches SW2-1 to SW2-5, respectively. When one switch (for instance, switches SW1-1 to SW1-5) is under active condition, the other switch (for example, switches SW2-1 to SW2-5) is under not activated condition. Even in any of the operation modes, the respective pumping circuits are continuously driven.

With such a structure, the pumping circuit PUMP 1 outputs the boosted voltage higher than the operation voltage Vdd.

There are achieved the following advantages in accordance with the above-explained preferred embodiments of the present invention.

(1) The first oscillating circuit for producing the pulse signal with the high frequency, the operation of which is controlled by the output signal of the voltage detecting circuit, and the second oscillating circuit for producing the pulse signal with the low frequency, which is normally operated, are employed. In response to the operation mode, the pulse signal with the high frequency, the pulse signal with the low frequency, or the pulse signal which has been formed based upon either the externally inputted operation timing, or the internally formed operation timing is selectively derived by the selector. The pumping circuits are operated which produce the boosted high voltage with respect to the substrate back-gate bias voltage, or the internal operation voltage. The frequencies of the pulse signal inputted into a single pumping circuit are selected in response to the operation modes, whereby the current supply capabilities are controlled. As a result of elimination of the subsidiary circuit, the occupied area can be made small, and furthermore low power consumption can be realized by setting the frequency of the pulse signal to the low values in such an operation mode that the leak current is compensated by employing the capacitors having the large capacitances of the main circuit.

(2) In the dynamic RAM which contains two pumping circuits for producing the above-explained substrate back-gate bias voltage and the boosted high voltage, the second oscillating circuit is commonly employed, so that the entire circuit can be furthermore made simple and also low power consumption can be further achieved.

(3) The above-explained pumping circuit for producing the substrate back-gate bias voltage is operated not only when the power supply is turned ON, but also when the burn-in test is carried out, whereby the latch up occurring in the burn-in test can be prevented.

While the present invention has been described with reference to the various preferred embodiments, the present invention is not limited thereto, but may be changed, modified without departing from the technical aspect of the present invention. For instance, the dynamic RAM contains only either the substrate back-gate bias voltage generating circuit (pumping circuit), or the boosted voltage generating circuit. The circuit for changing the frequencies of the pulse signals inputted from a single pumping circuit, may be modified, depending upon the circuit scale of the dynamic RAM and the respective operation modes. Instead of the above-described dynamic RAM, a so-called quasi-static type RAM may be employed in which dynamic memory cells are employed as the memory cell, and the input/output interface owns compatibilities with the static RAM. Also, a specific-purpose dynamic RAM may be employed which owns a serial input/output function at an input/output unit for an image processing operation.

In the above-described preferred embodiments, the present invention has been applied to the dynamic RAM. Alternatively, the present invention may be applied to other memories such as EEPROMs, and other semiconductor integrated circuits. That is to say, the present invention may be applied to such a semiconductor integrated circuit which is driven by two sorts of power source voltages, e.g., an operation voltage and a ground voltage.

What is claimed is:

1. A voltage generating circuit in a semiconductor integrated circuit comprising:

a first oscillating circuit outputting a first pulse signal having a first frequency;

a second oscillating circuit outputting a second pulse signal having a second frequency which is lower than said first frequency;

a selector having a first input terminal coupled to said first oscillating circuit for receiving said first pulse signal, a second input terminal coupled to said second oscillating circuit for receiving said second pulse signal and an output terminal;

a pumping circuit having an input terminal coupled to said output terminal of said selector, said pumping circuit receiving a power supply voltage and outputting a boosted voltage having an absolute value larger than that of said power supply voltage; and a power supply voltage turn-ON detecting circuit coupled to said selector, wherein said power supply voltage turn-ON detecting circuit controls said selector so that said selector outputs said first pulse signal to said input terminal of said pumping circuit in response to a detection by the detecting circuit that said power supply voltage is turned ON.

2. A voltage generating circuit in a semiconductor integrated circuit according to claim 1, wherein said second oscillating circuit outputs said second pulse signal to said second input terminal of said selector constantly.

3. A voltage generating circuit in a semiconductor integrated circuit according to claim 1, further comprising:

a boosted voltage detecting circuit receiving said boosted voltage, said boosted voltage detecting circuit controlling said selector so that said selector outputs said second pulse signal to said input terminal of said pumping circuit when said boosted voltage is higher than a predetermined voltage.

4. A voltage generating circuit in a semiconductor integrated circuit according to claim 3, wherein said first oscillating circuit does not output said first pulse signal when said boosted voltage detecting circuit detects that said boosted voltage is higher than said predetermined voltage.

5. A voltage generating circuit in a semiconductor integrated circuit comprising:

a first oscillating circuit outputting a first pulse signal having a first frequency;

a second oscillating circuit outputting a second pulse signal having a second frequency which is lower than said first frequency;

a selector having a first input terminal coupled to said first oscillating circuit for receiving said first pulse signal, a second input terminal coupled to said second oscillating circuit for receiving said second pulse signal and an output terminal;

a pumping circuit having an input terminal coupled to said output terminal of said selector, said pumping circuit receiving a power supply voltage and outputting a boosted voltage having an absolute value larger than that of said power supply voltage; and a boosted voltage detecting circuit coupled to receive said boosted voltage, said boosted voltage detecting circuit controlling said selector so that said selector outputs said second pulse signal to said input terminal of said pumping circuit when said boosted voltage is higher than a predetermined voltage.

6. A voltage generating circuit in a semiconductor integrated circuit according to claim 5, wherein said second oscillating circuit outputs said second pulse signal to said second input terminal of said selector constantly.

7. A voltage generating circuit in a semiconductor integrated circuit according to claim 5, wherein said first oscillating circuit does not output said first pulse signal when said boosted voltage detecting circuit detects that said boosted voltage is higher than said predetermined voltage.

8. A voltage generating circuit in a semiconductor integrated circuit comprising:

a first oscillating circuit outputting a first pulse signal having a first frequency;

a second oscillating circuit outputting a second pulse signal having a second frequency which is lower than said first frequency;

a selector having a first input terminal coupled to said first oscillating circuit for receiving said first pulse signal, a second input terminal coupled to said second oscillating circuit for receiving said second pulse signal and an output terminal;

a pumping circuit having an input terminal coupled to said output terminal of said selector, said pumping circuit receiving a power supply voltage having a positive polarity and outputting a negative polarity voltage; and a power supply voltage detecting circuit coupled to said selector, wherein said power supply voltage detecting circuit controls said selector so that said selector outputs said first pulse signal to said input terminal of said pumping circuit when said power supply voltage is larger than a predetermined voltage.

9. A voltage generating circuit in a semiconductor integrated circuit according to claim 8, wherein said negative polarity voltage is a substrate back-gate bias voltage.

10. A voltage generating circuit in a semiconductor integrated circuit according to claim 8, wherein said power supply voltage detecting circuit detects a burn-in test mode of said semiconductor integrated circuit.

11. A voltage generating circuit in a semiconductor integrated circuit according to claim 10, wherein said semiconductor integrated circuit is positioned into an oven at a high temperature when said semiconductor integrated circuit is a burn-in test mode.

12. A voltage generating circuit in a semiconductor integrated circuit according to claim 8, further comprising a power supply voltage turn-ON detecting circuit coupled to said selector, wherein said power supply voltage turn-ON detecting circuit controls said selector so that said selector outputs said first pulse signal to said input terminal of said pumping circuit when said power supply voltage is turned ON.

13. A voltage generating circuit in a semiconductor integrated circuit according to claim 8, wherein said second oscillating circuit outputs said second pulse signal to said second input terminal of said selector constantly.

* * * * *